United States Patent [19]
Ozaki

[11] Patent Number: 5,498,292
[45] Date of Patent: Mar. 12, 1996

[54] HEATING DEVICE USED FOR A GAS PHASE GROWING MECHANISM OR HEAT TREATMENT MECHANISM

[75] Inventor: Yasushi Ozaki, Sagamihara, Japan

[73] Assignee: Kishimoto Sangyo Co., Ltd., Osaka, Japan

[21] Appl. No.: 374,828

[22] Filed: Jan. 19, 1995

[30] Foreign Application Priority Data

Jun. 16, 1994 [JP] Japan ................................. 6-158039

[51] Int. Cl.⁶ .......................... C23C 16/00; F27B 1/09; F27B 5/04
[52] U.S. Cl. .................. 118/724; 118/715; 118/725; 392/418; 432/205; 432/241; 432/253
[58] Field of Search .................. 118/715, 724, 118/725; 219/635, 638; 392/416, 418; 432/5, 6, 11, 152, 205, 241, 253

[56] References Cited

U.S. PATENT DOCUMENTS

| | | | |
|---|---|---|---|
| 4,760,244 | 7/1988 | Hokynar | 219/390 |
| 5,029,554 | 7/1991 | Miyashita | 118/715 |
| 5,074,954 | 12/1991 | Nishizawa | 156/610 |
| 5,164,012 | 11/1992 | Hattori | 118/725 |
| 5,329,095 | 7/1994 | Okase | 219/390 |
| 5,395,452 | 3/1995 | Kobayashi | 118/715 |

FOREIGN PATENT DOCUMENTS

| | | | |
|---|---|---|---|
| 3906075 | 8/1990 | Germany | 118/724 |
| 1273499 | 5/1972 | United Kingdom | 432/205 |

Primary Examiner—R. Bruce Breneman
Assistant Examiner—Jeffrie R. Lund
Attorney, Agent, or Firm—Armstrong, Westerman, Hattori, McLeland & Naughton

[57] ABSTRACT

A heating device used for a gas phase growing mechanism or a heat treatment mechanism comprising a tubular reactor made of a heat resistant and chemically inert material incorporating a support having a plurality of works set and arranged thereon to be put to gas phase growing or heat treatment, a cylindrical main heating furnace body disposed so as to surround the outer circumferential surface of the tubular reactor 1 at the entire length thereof, and a pair of auxiliary heating furnace bodies each closing both longitudinal opening ends of the cylindrical main heating body, whereby the cylindrical main heating furnace body and the pair of auxiliary heating furnace bodies constitute a heating furnace for confining the tubular reactor therein.

4 Claims, 2 Drawing Sheets

HEATING DEVICE USED FOR A GAS PHASE GROWING MECHANISM OR HEAT TREATMENT MECHANISM

BACKGROUND OF THE INVENTION

1. Field of the Invention

This invention concerns a heating device used for a gas phase growing mechanism or a heat treatment mechanism for forming thin films such as insulation films or semiconductor films on a semiconductor substrate or a liquid crystal substrate of electronic parts.

2. Description of the Related Art

The present invention concerns a heating device used for a heating mechanism for conducting gas phase growing (CVD: chemical vapor deposition) of forming thin films such as insulation films, or semiconductor films on semiconductor substrates or on liquid crystal substrates of electronic parts by supplying predetermined gases for forming desired thin films by way of chemical reactions to the surface of a material to be processed (work) under heating at a reduced pressure, or conducting heat treatment of thermally diffusing predetermined gases into work by heat treatment, or applying a desired treatment means to a work by heating in an atmosphere of a predetermined gas, in a tightly closed tubular reactor disposed in a heating furnace, thereby improving the heat efficiency of the heating furnace, reducing the size of the furnace, enabling treatment for a greater amount of work with reference to the identical furnace volume as compared with those of the prior art.

DESCRIPTION OF THE PRIOR ART

Heating mechanisms comprises a tubular or cylindrical heating furnace disposed with respect to an outer circumference of a tubular reactor mainly composed of a heat resistant and chemically inert material, such as quartz or silicon carbide, having a support incorporated therein for supporting a plurality of items to be heated. The tubular reactor, as the main component of the mechanism, is disposed horizontally or vertically and, based on the mode of disposition, is referred to as a horizontal type or vertical type heating mechanism.

In the heating mechanism, either of the horizontal or vertical type, it is important that the temperature is set uniformly to the work as the essential factor of heat treatment operation. Accordingly, the work is disposed in a stable heating temperature zone referred to as a uniform heating region at a central portion with respect to the length of the tubular reactor, in which most stable heat treatment can be attained.

Since, the heating furnace of the prior art basically has a cylindrical or tubular structure, a greater amount of the heat is dissipated from each of opening ends and uniform heating at the setting temperature can be obtained only at a longitudinal central portion of the heating furnace.

Then, in order to obtain the uniform heating region, in the tubular reactor disposed inside of the heating furnace, a pair of auxiliary heating furnaces are disposed ahead and behind the uniform heating region in a horizontal type and below and above the uniform heating region in a vertical type, with an aim of forming an auxiliary heating regions for compensating the heating effect of the central uniform heating region.

This additionally requires the auxiliary heating furnaces disposed adjacent to both sides of the uniform heating region and, therefore, further requires a longer tubular reactor at least corresponding to the entire length of the main heating furnace and the auxiliary heating furnaces. This brings about a disadvantage that the longitudinal size of the heating device is increased and that only a smaller amount of work can be contained in relation to the long-sized tubular reactor.

OBJECT AND SUMMARY OF THE INVENTION

It is, therefore, an object of the present invention to eliminate the foregoing drawbacks in the prior art and provide a heating device used for a gas phase growing mechanism or a heat treatment mechanism, in which both longitudinal opening ends of a main cylindrical heating furnace body having greatest heat dissipation rate are closed, each with an auxiliary heating furnace body, thereby eliminating the disposition of the auxiliary heating regions that are adjacent to the main heating regions in the longitudinal direction of the heating furnace, enabling to utilize all the inner space of the tubular reactor as the effective uniform heating region, increasing the amount of works just in proportion with the volume of the uniform heating region, saving heat calories and reducing the size of the entire heating device.

The foregoing object of the present invention can be attained by a heating device used for a gas phase growing mechanism or a heat treatment mechanism comprising:

a tubular reactor made of a heat resistant and chemically inert material incorporating a support having a plurality of workpieces set and arranged thereon to be put to gas phase growing or heat treatment, a main cylindrical heating furnace body disposed so as to surround the outer circumferential surface of the tubular reactor along the entire length thereof, and a pair of auxiliary heating furnace bodies each closing both longitudinal opening ends of the main cylindrical heating furnace body, whereby the cylindrical main heating furnace body and the pair of auxiliary heating furnace bodies constitute a heating furnace for confining the tubular reactor therein.

In a preferred embodiment of the present invention, the tubular reactor has at one longitudinal end thereof an exhaust conduit in communication with the inside and protruded from the one longitudinal end of the tubular reactor, and one of the auxiliary heating furnace bodies has a conduit insertion hole perforated therethrough for passing the exhaust conduit to the outside.

In another preferred embodiment of the present invention, the tubular reactor has at the other longitudinal end thereof a transportation port for charge/discharge of the support and a door for opening and closing the transportation port, and the other of the auxiliary heating furnace bodies is disposed to the outer side of the door.

In a still further embodiment of the present invention, the door has a main part that protrudes in the direction from the other longitudinal opening end to the inside of the tubular reactor and a flange disposed along the circumferential edge at the outer side of the main part and capable of intimate contact with a circumferential edge of the transportation port disposed at the other longitudinal end of the tubular reactor and the other of the auxiliary heating furnace bodies is disposed in the recess of the protruding main part.

According to the present invention, since the auxiliary heating furnace bodies are disposed on both longitudinal opening ends of the cylindrical main heating furnace body surrounding the outer circumferential surface of the tubular reactor over the entire length, the entire outer circumference of the tubular reactor is covered with heating means namely, the main cylindrical heating furnace body and the auxiliary heating furnace bodies. Thus, a uniform heating region is formed throughout the inside of the tubular reactor over the entire length. Therefore, workpieces can be treated in the entire region inside the tubular reactor.

As described above, since the tubular reactor has a cylindrical shape, as a whole, and heat treatment is generally conducted under vacuum or at a greatly reduced pressure in an atmosphere of a predetermined species of gases other than atmospheric air, the top end of the tubular reactor is made as a semi-spherical shape so as to resist an external atmospheric pressure. Further, the shape at the rear end of the reactor door for charge/discharge of workpieces also has a semi-spherical shape, like the shape, of the top end, so as to resist the atmospheric pressure.

Further, the exhaust conduit is formed at and protruded from a portion of the generally semi-spherical surface at the top end of the tubular reactor, and one of the auxiliary heating furnace bodies disposed adjacent to the top end of the tubular reactor has a circular shape having a through hole penetrated therein for passing the exhaust conduit to the outside. Further, it is also desirable that the inner surface of the other of the auxiliary heating furnace bodies is formed as a semi-spherical shape coping with the generally semi-spherical surface at the top end of the tubular reactor.

In the transportation port opened at the rear end of the tubular reactor, the door generally of a U-shaped configuration is provided. The door has along its outer circumferential, that is, pedestal edge a flange capable of sealing the transporting port by intimate contact by way of a door manifold. The main part of the door protrudes into the inside of the tubular reactor with a semi-spherical shape so as to resist the atmospheric pressure. The auxiliary heating furnace body enclosed within the main part at the protruding (concave as viewed from the end) portion. Then, the cylindrical main heating furnace body, the auxiliary heating furnace body disposed at the top end, and the auxiliary heating furnace body disposed at the back of the door constitute a heating furnace confining the tubular reactor. The entire volume in the tubular reactor can be utilized for most effective uniform heating and all the workpieces contained in the tubular reactor can be put to uniform heat treatment.

DESCRIPTION OF THE PREFERRED EMBODIMENTS

Figure 1:
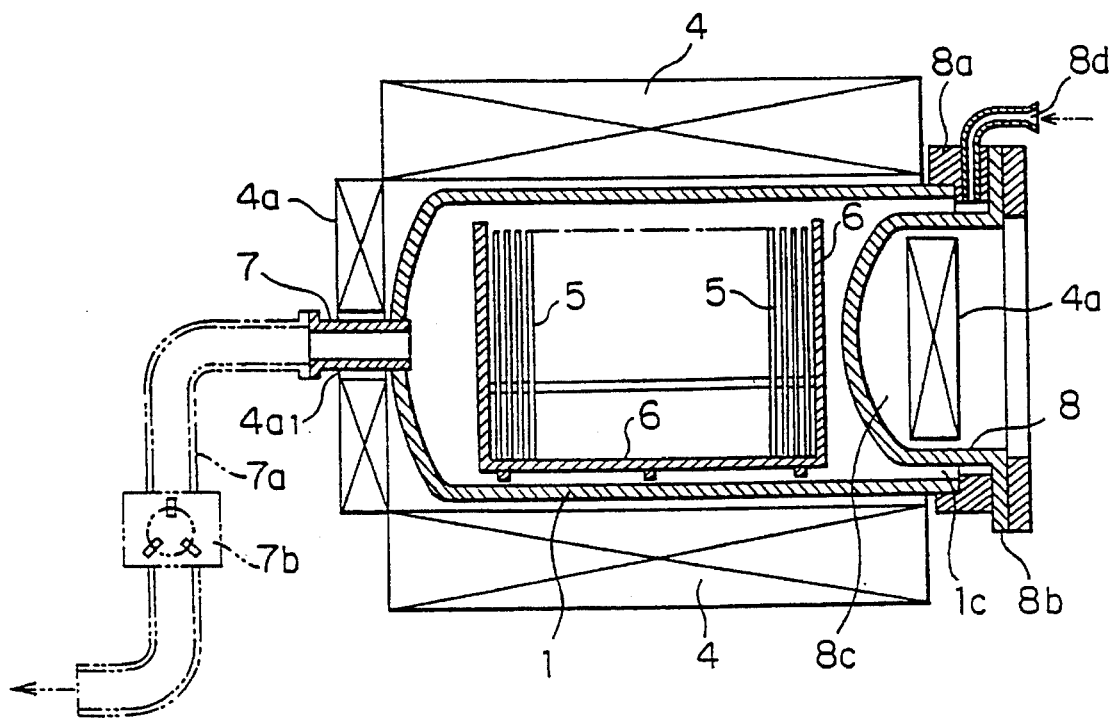
FIG. 1 is an entire cross sectional view of a heating device according to the present invention.
Figure 2:
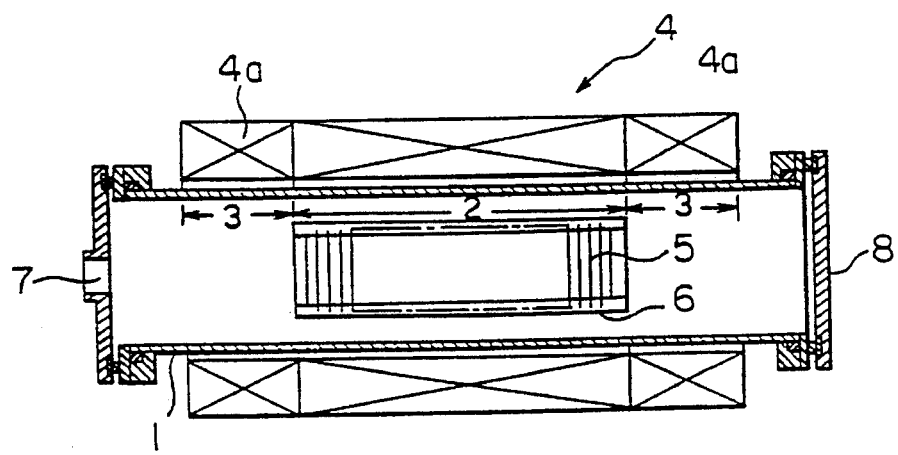
FIG. 2 is a cross sectional view of a horizontal type heating device in the prior art.
Figure 3:
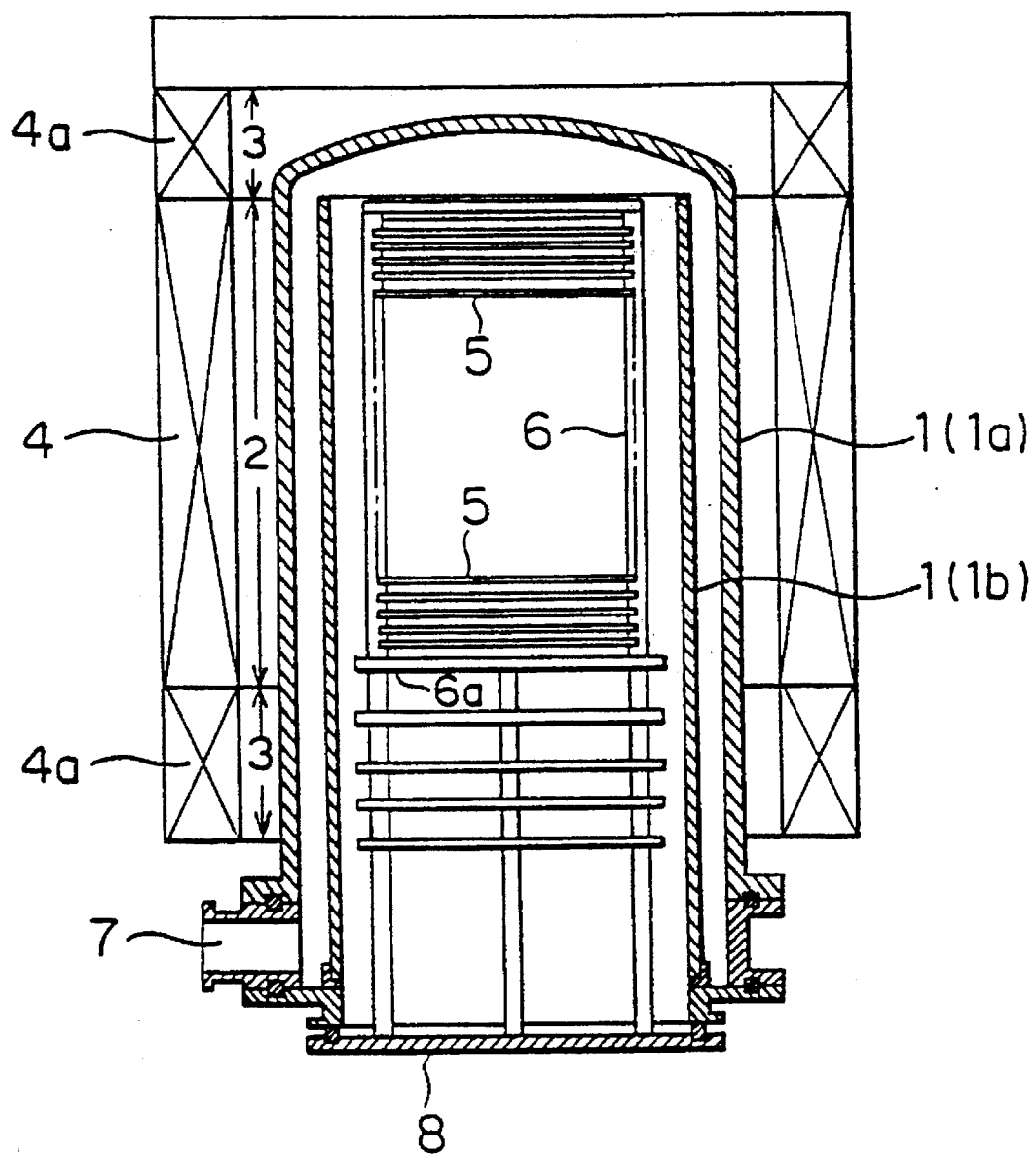
FIG. 3 is a cross sectional view of a vertical type heating device in the prior art.

Description will be made to the present invention by way of its preferred embodiment with reference to the accompanying drawings, in which FIG. 1 is a schematic cross sectional view illustrating the present invention and FIG. 2 and FIG. 3 are schematic cross sectional views of the heating furnaces in the prior art which are incorporated here for comparison with the present invention. FIG. 2 shows a horizontal type furnace and FIG. 3 shows a vertical type furnace respectively. In each of FIG. 2 and FIG. 3, main components carry the same reference numerals as the main components of the present invention shown in FIG. 1.

Prior to explanation for the preferred embodiment of the present invention, description will be made briefly to the structure of the heating furnace of the prior art.

FIG. 2 is a schematic cross sectional view for the structure of a horizontal type heating furnace.

A tubular reactor 1, for example, made of a quartz tube or silicon carbide tube has a predetermined uniform diameter in which a lid for connection with an exhaust conduit 7 is tightly secured at a front end, while a door 8 is disposed to the rear end of the tubular reactor 1 such that it can tightly close and open the rear end. A main heating furnace body 4 surrounds the longitudinal outer circumference of the tubular reactor 1.

For providing a uniform heating region which is always kept at a setting temperature inside of the tubular reactor 1 contained in the heating furnace, auxiliary heating furnace bodies 4a, 4a are formed ahead and behind a main heating furnace body 4a. Auxiliary heating regions 3, 3 are thus formed ahead and behind the region 2 thereby making the heating region as a uniform heating region 2. Workpieces 5 are treated only within the thus formed uniform heating region 2.

Referring then to the structure of the vertical type heating furnace of the prior art based on FIG. 3, a tubular reactor 1 has a double walled structure comprising an outer tube 1a and an inner tube 1b made of quartz or silicon carbide. The outer tube 1a has a cylindrical shape bottomed at one end with a generally semi-spherical shape and opened at the other end. The inner tube 1b has a cylindrical shape opened at both ends. The outer tube 1a is stood vertically with the semi-spherically shaped end closing the upper end, and the inner tube 1b disposed coaxially with a slight radial gap at the inside of the outer tube 1a.

As shown in FIG. 3, the lower edge of the semi-spherical shape at the top end of the outer tube 1a is aligned with the upper end edge of the inner tube 1b, at which the inside of the inner tube 1b is in communication with the inside of the outer tube 1a. However, they are not in communication to each other at the lower end of the tubular reactor 1. An exhaust duct 7 is connected with of the outer tube 1a at the lower end thereof. Further, a portion at the lower end of the inner tube 1b is provided with a door 8 for opening and closing a transportation port for charge/discharge of workpieces 5.

A main heating furnace body 4 is disposed around the entire outer circumference of the outer tube 1a such that a uniform heating region 2 is formed over a range from the upper limit at the upper end of the inner tube 1b to the lower limit at a height about 1/3 of the entire height of the tubular reactor 1.

Further, an auxiliary upper heating furnace body 4a is attached to the outer circumference of the outer tube 1a over a range from the upper limit near at the top end of the semi-spherical shape to the lower limit at the upper end of the main heating furnace body 4, to form an auxiliary upper heating region 3. The auxiliary upper heating region 3 is smaller as compared with that in the horizontal type described previously, because no large auxiliary heating region 3 is required since the upper end of the outer tube 1a is closed by the semi-spherical bottom and heat less dissipates therefrom. Further, an auxiliary lower heating body 4a is disposed contiguous with the lower end of the main heating furnace body 4. Thus, the auxiliary upper and lower heating regions 3 and 3 and the uniform heating region 2 put therebetween are formed in the tubular reactor 1.

In both of the horizontal and vertical type heating furnaces, semiconductor substrates or liquid crystal substrates as the workpieces which are arranged on and held by a support 6 are inserted and set into the thus formed uniform heating region 2 in the vertical type heating furnace, a port table 6a is used as a stand for accurately setting the support 6 in the uniform heating region 2.

The heating furnace 3 of the prior art having the foregoing constitution basically comprises a cylindrical form and, as a result, a great amount of heat dissipates from both opening ends, so that auxiliary heating furnace bodies 4a, 4a are supplementally disposed ahead and behind or above and below the main heating furnace body 4 in order to provide the uniform heating region 2 in the tubular reactor.

On the contrary to the prior art described above, the main heating furnace body 4 of the present invention basically has a cylindrical configuration and both longitudinal opening ends are closed by a pair of auxiliary heating furnace bodies 4a, 4a, in which the main cylindrical heating furnace body 4 and the auxiliary heating furnace bodies 4a, 4a that close both longitudinal opening ends of the main cylindrical heating furnace body 4 define a heating furnace having an inner cavity which confines the tubular reactor 1.

The tubular reactor 1 has a cylindrical shape with a diameter being identical substantially over the entire length, and an exhaust conduit 7 drawn into a small diameter is protruded from a spherical top end (left end in FIG. 1) of the tubular reactor 1 so as to withstand a pressure difference between the inside and the outside of the reactor 1.

At the rear end (right end in FIG. 1) of the tubular reactor 1, the tubular reactor 1 opens with a diameter identical with that for the main part as a transportation port 1c for charge/discharge of a plurality of workpieces 5, and a door 8 is detachably disposed with respect to the opening end of the tubular reactor 1 for opening/closing the transportation port 1c. The auxiliary heating furnace body 4a is disposed such that it can conform to the shape at the end of the tubular reactor 1 for closing the reactor.

The door 8 has a flange 8b at the outer circumferential edge thereof that can abut against a door manifold 8a defining the opening edge at the rear end of the tubular reactor 1 and the inner circumference of the flange 8b is contiguous with a protruding portion 8c protruding to the inside of the tubular reactor 1. The outer circumference of the protruding portion 8c has such a diameter as can be inserted into the tubular reactor 1 at the position of the door manifold 8a. The protruding portion 8c has a generally semi-spherical surface protruding right-to-leftwardly (FIG. 2) in the reactor so as to resist the pressure difference between the inside and the outside of the tubular reactor 1. The auxiliary heating furnace body 4a is fixed and disposed with respect to a recess formed by the protruding portion 8c.

The exhaust conduit 7 protrudes externally (leftwardly in FIG. 1) from the opening end of the main heating furnace body 4. A conduit insertion hole 4a1 is placed in the auxiliary heating furnace body 4a that closes the opening at the top end (left end) of the main heating furnace body 4 for inserting and penetrating the exhaust conduit 7 which is contiguous with the left end of the tubular reactor 1 and abuts against and closes the opening end of the main heating furnace body 4.

In the drawing, an exhaust pipe 7a has a vacuum pump 7b interposed at the midway, and the exhaust pipe 7a can be connected with the exhaust conduit 7 that protrudes from the top end of the tubular reactor 1.

In the heating furnace surrounding the tubular reactor of the prior art, since the heating furnace basically has a cylindrical shape, a great amount of heat dissipates from both longitudinal open ends, a uniform heating region at a setting temperature is defined only to a small region in a longitudinal central portion, so that the auxiliary heating furnace bodies are disposed adjacent to the main heating furnace body in order to obtain a stable setting temperature in the uniform heating region. This makes the entire length of the heating furnace longer and lowers the working efficiency and the heat efficiency relative to the volume. However, in the heating device of the present invention having the foregoing constitution, although the cylindrical shape in the prior art is employed as it is as the basic configuration, both longitudinal ends of the cylinder which dissipate a great amount of heat are closed with auxiliary heating furnace bodies, so that auxiliary heating regions in the longitudinal direction can be eliminated and both of the working efficiency and the heat efficiency relative to a determined volume can be improved.

What is claimed is:

1. A heating device used for a gas phase growing mechanism or a heat treatment mechanism comprising:

a tubular reactor (1) made of a heat resistant and chemically inert material incorporating a support (6) having a plurality of workpieces (5) set and arranged thereon to be put to a gas phase growing or heat treatment, a cylindrically formed main heating furnace body (4) having open opposite ends, said cylindrical main heating furnace body being disposed so as to surround the outer circumferential surface of said tubular reactor (1) along substantially the entire length thereof, a pair of auxiliary heating furnace bodies separate from said main heating furnace body and each closing the respective longitudinal open ends of said cylindrical main heating body (4), whereby said cylindrical main heating furnace body and said pair of auxiliary heating furnace bodies cooperate to form a heating furnace confining said tubular reactor (1) therein.

2. A heating device, used for a gas phase growing mechanism or a heat treatment mechanism comprising:

a tubular reactor (1) made of a heat resistant and chemically inert material incorporating a support (6) having a plurality of workpieces (5) set and arranged thereon to be put to gas phase growing or heat treatment, a cylindrical main heating furnace body (4) disposed so as to surround the outer circumferential surface of said tubular reactor (1) at the entire length thereof, and a pair of auxiliary heating furnace bodies each closing both longitudinal opening ends of said cylindrical main heating body (4), whereby said cylindrical main heating furnace body and said pair of auxiliary heating furnace bodies constitute a heating furnace confining said tubular reactor (1) therein and wherein the tubular reactor (1) has at one longitudinal end thereof an exhaust conduit (7) in communication with the inside and protruded from said one longitudinal end of said tubular reactor (1), and one of the auxiliary heating furnace bodies (4a, 4a) has a conduit insertion hole (4a1) extending therethrough for passing said exhaust conduit (7) to the outside.

3. A heating device as defined in claim 2, wherein the tubular reactor (1) has at the other longitudinal end thereof a transportation port (1*c*) for charge/discharge of the support (6) and a door (8) for opening and closing said transportation port (1*c*), and the other of the auxiliary heating furnace bodies (4*a*, 4*a*) is disposed to the outer side of said door (8).

4. A heating device as defined in claim 3, wherein the door (8) has a main part that protrudes in the direction from the other longitudinal opening end to the inside of the tubular reactor (1) and a flange (8*b*) disposed along the circumferential edge at the outer side of said main part and capable of intimate contact with a circumferential edge of the transportation port (1*c*) disposed at the other longitudinal end of the tubular reactor (1) and the other of the auxiliary heating furnace bodies (4*a*, 4*a*) is disposed in a recess of the protruding main part (8*c*).

\* \* \* \* \*